(12) United States Patent
Srivastava

(10) Patent No.: US 6,225,745 B1
(45) Date of Patent: May 1, 2001

(54) DUAL PLASMA SOURCE FOR PLASMA PROCESS CHAMBER

(75) Inventor: Aseem K. Srivastava, Gaithersburg, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/466,999

(22) Filed: Dec. 17, 1999

(51) Int. Cl.$^7$ .................................................. H01J 7/24
(52) U.S. Cl. ............................. 315/111.51; 315/111.21; 313/231.5; 156/345; 438/711
(58) Field of Search .................... 315/111.51, 111.21; 313/231.5; 156/345; 438/711

(56) References Cited

U.S. PATENT DOCUMENTS

| | | | |
|---|---|---|---|
| 4,341,941 | * 7/1982 | Tateno | 219/121 PU |
| 5,397,962 | 3/1995 | Moslehi | 315/111.51 |
| 5,498,308 | 3/1996 | Kamarehi et al. | 156/345 |
| 5,734,143 | 3/1998 | Kawase et al. | 219/121.43 |
| 5,772,832 | 6/1998 | Collins et al. | 156/345 |
| 5,792,272 | * 8/1998 | van Os et al. | 315/111.51 |
| 5,846,883 | * 12/1998 | Moslehi | 438/711 |
| 5,908,319 | 6/1999 | Xu et al. | 438/725 |

* cited by examiner

Primary Examiner—Don Wong
Assistant Examiner—Jimmy Vu
(74) Attorney, Agent, or Firm—John A. Kastelic

(57) ABSTRACT

A dual plasma source (80) is provided for a plasma processing system (10), comprising a first plasma source (82) and a second plasma source (84). The first plasma source (82) has a first plasma passageway (86) for transporting a first plasma therethrough toward a processing chamber (16), the first plasma passageway providing a first inlet (90) for accepting a first gas mixture to be energized by the first plasma source. The second plasma source (84) is connected to the first plasma source (82) and has a second plasma passageway (88) for transporting a second plasma therethrough toward the processing chamber (16), the second plasma passageway providing a second inlet (92) for accepting a second gas mixture to be energized by the second plasma source. The first plasma passageway (86) is constructed from a material that resists atomic oxygen recombination with the first plasma, and the second plasma passageway (88) is constructed from a material that resists etching by the second plasma. In a more limited embodiment, the first plasma passageway (86) is constructed from quartz ($SiO_2$) and the second plasma passageway is (88) constructed from alumina ($Al_2O_3$) or single crystal alumina (sapphire).

22 Claims, 6 Drawing Sheets

DUAL PLASMA SOURCE FOR PLASMA PROCESS CHAMBER

FIELD OF THE INVENTION

The present invention relates generally to the field of semiconductor processing systems such as photoresist ashers, and more specifically to a dual plasma source for use in such systems.

BACKGROUND OF THE INVENTION

In the manufacture of integrated circuits, photolithography techniques are used to form integrated circuit patterns on a substrate. Typically, the substrate is coated with a photoresist, portions of which are exposed to ultraviolet (UV) radiation through a mask to image a desired circuit pattern on the photoresist. The portions of the photoresist left unexposed to the UV radiation are removed by a processing solution, leaving only the exposed portions on the substrate. These remaining exposed portions are baked during a photostabilization process to enable the photoresist to withstand subsequent processing.

After such processing, in which the integrated circuit components are formed, it is generally necessary to remove the baked photoresist from the wafer. In addition, residue that has been introduced on the substrate surface through processes such as etching must be removed. Typically, the photoresist is "ashed" or "burned" and the ashed or burned photoresist, along with the residue, is "stripped" or "cleaned" from the surface of the substrate.

One manner of removing photoresist and residues is by directing a microwave-energized plasma at the substrate surface. Typically, the plasma is formed by a gas mixture that is transported through a plasma tube that passes through a microwave cavity. Microwave energy within the cavity is introduced into the plasma tube to excite the gas mixture therein and form a plasma. The plasma passes from the tube into a process chamber in which resides a photoresist-coated semiconductor substrate to be ashed.

One type of gas mixture that is used to generate the plasma is oxygen-based. For such a gas mixture, a quartz plasma tube is suitable and provides an efficient means for transporting the plasma to the process chamber. Other types of materials used for constructing the plasma tube are less efficient in transporting the plasma to the process chamber. For example, if a sapphire tube is used, atomic oxygen in the plasma recombines with the inner surface of the sapphire tube, reducing the amount of atomic oxygen available for the ashing process.

For certain ashing and other plasma-related processes (e.g., residue removal), it has been found that a source of fluorine may be added to the process gas mixture constituency to provide for more effective or efficient processing (e.g., enhanced ash rates). Such improved ash rates (and residue removal capabilities of fluorine), however, are achieved at the expense of degradation of the quartz plasma tube. The degradation is caused by the fluorine in the process gas mixture that etches the inner surface of the quartz tube. The use of a sapphire tube for a fluorine-oxygen based plasma will prevent fluorine etching of the inner surface of the tube. However, the use of a sapphire tube for such a plasma reintroduces the problem of atomic oxygen recombination with the inner surface of the sapphire tube. In addition, it has been found that ash rates of photoresist using a sapphire plasma tube when using non-fluorine chemistries are markedly lower than ash rates observed when using similar gas flows in a quartz plasma tube.

Accordingly, it is an object of the present invention to provide a plasma source for a semiconductor substrate processing system, such as a plasma asher, that permits the use of oxygen-fluorine plasma chemistries that suffers from neither (i) fluorine degradation of the plasma-carrying transport tube or (ii) atomic oxygen recombination with the surface of the sapphire tube, while providing suitable photoresist ashing rates. It is a further object of the present invention to provide a switching mechanism such that using the same asher, a user may select between (i) non-fluorine chemistries, using a quartz-like plasma tube in which the plasma is generated to avoid the deleterious effects of oxygen recombination, thereby achieving suitably high ash rates, and/or (ii) fluorinated chemistries, using a sapphire-like tube in which the plasma is generated tube to avoid the deleterious effects of etching.

SUMMARY OF THE INVENTION

A dual plasma source is provided for a plasma processing system, comprising a first plasma source and a second plasma source. The first plasma source has a first plasma passageway for transporting a first plasma therethrough toward a processing chamber, the first plasma passageway providing a first inlet for accepting a first gas mixture to be energized by the first plasma source. The second plasma source is connected to the first plasma source and has a second plasma passageway for transporting a second plasma therethrough toward the processing chamber, the second plasma passageway providing a second inlet for accepting a second gas mixture to be energized by the second plasma source. The first plasma passageway is constructed from a material that retards atomic oxygen recombination in the first plasma, and the second plasma passageway is constructed from a material that resists etching by the second plasma. In a more limited embodiment, the first plasma passageway is constructed from quartz ($SiO_2$) and the second plasma passageway is constructed from alumina ($Al_2O_3$) or single crystal alumina (sapphire).

DETAILED DESCRIPTION OF A PREFERRED EMBODIMENT

Figure 1A:
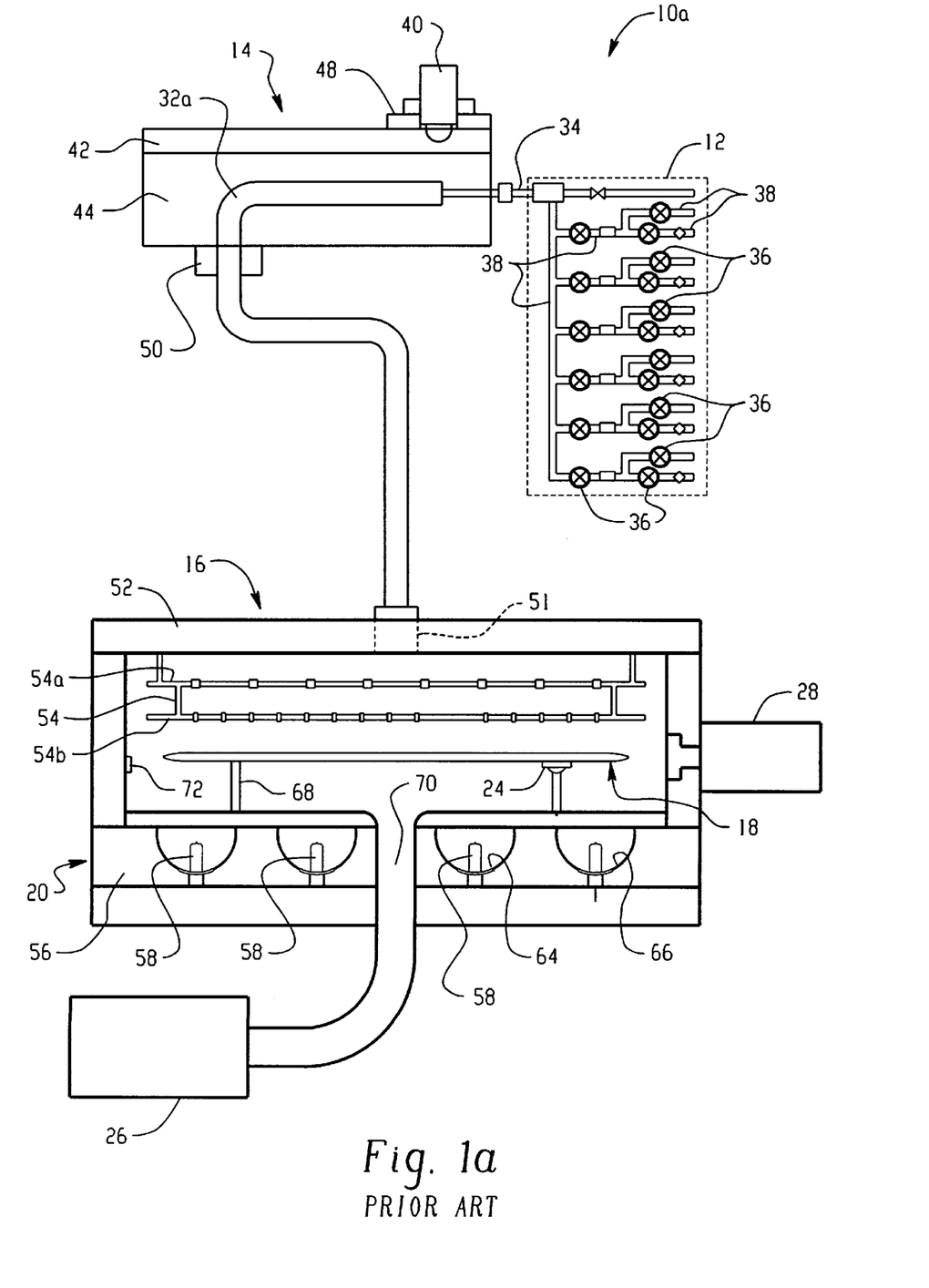
FIG. 1a is a cross sectional view of a prior art photoresist asher (having a quartz plasma tube) into which may be incorporated the dual plasma source of the present invention.
Figure 1B:
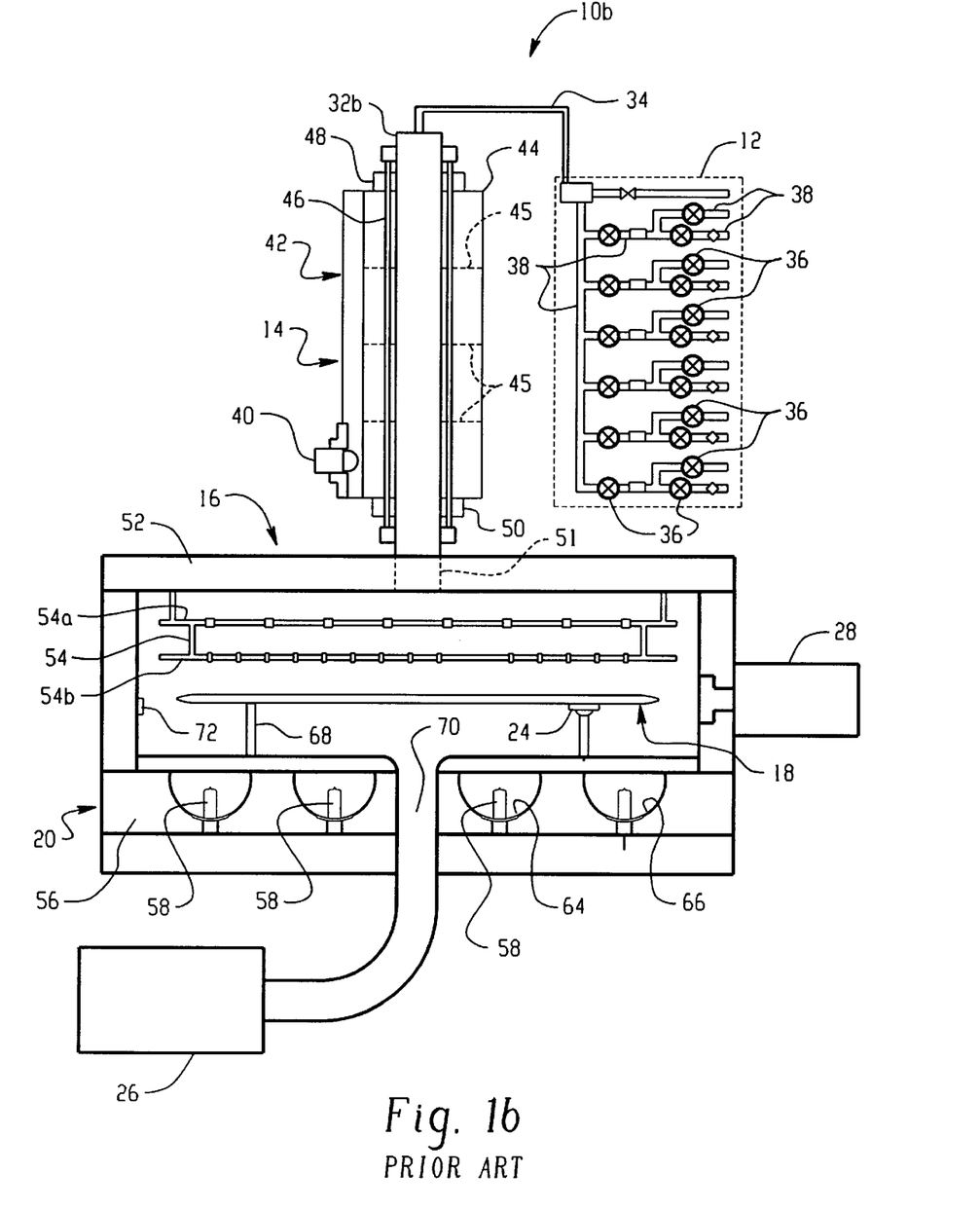
FIG. 1b is a cross sectional view of a prior art photoresist asher (having a sapphire plasma tube) into which may be incorporated the dual plasma source of the present invention.

Referring now to the drawings, FIGS. 1a and 1b discloses a prior art photoresist asher 10a and 10b, respectively, each comprising a gas box 12; a microwave power generator assembly 14; a process chamber 16 in which is heated a semiconductor substrate such as a wafer 18; and a radiant heater assembly 20 for heating the wafer 18, situated at the bottom of the process chamber. A temperature probe 24, such as a thermocouple, is used to monitor the temperature of the wafer 18 and provide a signal indicative thereof to the controller 22. A vacuum pump 26 is used to evacuate the process chamber 16 for processes requiring vacuum conditions. A monochromator 28 is used to monitor the optical emission characteristics of gases within the chamber to aid in process endpoint determination.

In operation, a desired mixture of gases is introduced into a plasma tube 32 from gas box 12 through an inlet conduit 34. In FIG. 1a, the plasma tube 32a is made of quartz and in FIG. 1b, the plasma tube 32b is made of sapphire. The gases forming the desired mixture are stored in separate supplies (not shown) and mixed in the gas box 12 by means of valves 36 and piping 38. One example of a desired gas mixture is forming gas (primarily nitrogen with a small percentage of hydrogen), and oxygen. Optionally, in the asher of FIG. 1b, a fluorine containing gas such as carbon tetrafluoride may be added to the gas mixture to improve ashing rates for certain processes.

The desired gas mixture is energized by the microwave power generator assembly 14 to form a reactive plasma that will ash photoresist on the wafer 18 in the process chamber 16 when heated by the radiant heater assembly 20. A magnetron 40 generates microwave energy that is coupled to a waveguide 42. Microwave energy is fed from the waveguide through apertures (not shown) in microwave enclosure 44, which surrounds the plasma tube 32.

As shown in FIG. 1b, the plasma tube 32b is made of alumina ($Al_2O_3$) or sapphire to accommodate fluorine plasma chemistries. An outer quartz cooling tube 46 surrounds the quartz plasma tube 32b, slightly separated therefrom. Pressurized air is fed into the gap between the tubes 32b and 46 to effectively cool the quartz tube 32b during operation. In FIG. 1b, the microwave enclosure 44 is segmented into sections shown by phantom lines 45. Segmentation of the enclosure 44 allows uniform microwave power distribution across the length of the sapphire tube, and protects it from overheating by preventing an unacceptably large thermal gradient from developing along its axial length when suitable input power is provided. Unlike quartz, sapphire is inclined to crack when heated unevenly. Each segment of the enclosure 44 is separately fed with microwave energy that passes through the quartz tube 46 and the sapphire tube 32 passing therethrough.

In either case (FIGS. 1a or 1b), the gas mixture within the plasma tube 32 (quartz or sapphire) is thereby energized to create a plasma. Microwave traps 48 and 50 are provided at the ends of the microwave enclosure 44 to prevent microwave leakage. Energized plasma enters the process chamber 16 through an opening 51 in the top wall 52 thereof.

The reactive plasma ashes the photoresist on the wafer 18. An apertured, dual layered baffle plate assembly 54, comprised of upper baffle plate 54a and lower baffle plate 54b, evenly distributes the reactive plasma across the surface of the wafer 18 being processed. The radiant heater assembly 20 comprises a plurality of tungsten halogen lamps 58 residing in a reflector that reflects and redirects the heat generated by the lamps toward the backside of the wafer 18 positioned within the process chamber 16 on pins 68. One or more temperature sensors 72, such as thermocouples, are mounted on the interior of process chamber wall 52 to provide an indication of wall temperature.

The present invention is embodied in a novel dual plasma source 80 that is mounted to a known process chamber 16 such as that shown in FIGS. 1a or 1b. FIGS. 2–9 show eight different embodiments of the dual plasma source, 80a–80h, respectively. Each of the eight embodiments utilizes individual microwave and/or radio frequency (RF) sources to comprise a first source 82 and a second source 84. The sources 82 and 84 may be operated together, or alone individually, depending upon the process being run, in order to maximize the usefulness of the dual plasma source 80.

In the first four embodiments (FIGS. 2–5) of the invention, a first plasma is generated in a first plasma passageway or tube 86 forming part of the first plasma source 82 and is transported to the process chamber through a second plasma passageway or tube 88 via coupling 89. A second plasma is (optionally) generated in the second plasma tube 88 which forms part of the second plasma source 84. A combined plasma, comprising the first and second plasmas, is directed from the second plasma tube 88 to the process chamber 16. A first inlet 90 is provided in the first plasma tube 86 for introduction of a first gas mixture to be energized to form the first plasma, and a second inlet 92 is provided in the coupling 89 for introduction of a second gas mixture to be energized in the second plasma tube 88 to form the second plasma.

In the fifth through eighth embodiments (FIGS. 6–9) of the invention, a first plasma is generated in a first plasma tube 86 forming part of the first plasma source 82. A second plasma is generated in a second plasma tube 94 forming part of the second plasma source 84. The first and second plasma tubes meet at a third plasma passageway or tube 96 that transports the combined plasma, comprising the first and second plasmas, to the process chamber 16. In each of the eight embodiments disclosed herein, the plasma tubes are constructed of a material that optimizes efficient plasma generation and transport through the tubes while minimizing plasma degradation of, or atomic recombination with, the tubes.

Referring back to FIG. 2 in detail, the first embodiment of a dual plasma source 80a is shown. The first plasma source 82a is a microwave driven plasma source comprising a magnetron 98a (first power source) and a waveguide 100a (first power transfer mechanism) through which the first plasma tube 86a passes. A desired mixture of gases (e.g., forming gas and oxygen) is introduced into the first plasma tube 86a via first inlet 90a. Microwave energy generated by the magnetron 98a (e.g., operating at 2.45 GHz) and coupled to the waveguide 100a energizes the gas mixture located in the portion of the first plasma tube 86a surrounded by the waveguide. In this first embodiment of FIG. 2, the first plasma tube is constructed of a material that resists atomic oxygen recombination with the first plasma, such as quartz ($SiO_2$).

The second plasma source 84a is a radio frequency (RF) driven plasma source comprising an RF source 102a (second power source) and a coil 104a (second power transfer mechanism) through which the second plasma tube 88a passes. A desired mixture of gases (e.g., a fluorinated gas such as carbon tetrafluoride) is optionally introduced into the second plasma tube 88a via second inlet 92a. A switch (not shown) may be used to establish or cut off the flow of a fluorinated gas to second inlet 92a. RF energy generated by the RF source 102a (e.g., operating at 13.56 MHz) and coupled to the coil 104a energizes the gas mixture located in the portion of the second plasma tube 88a surrounded by the coil. In this first embodiment of FIG. 2, the second plasma tube is constructed of a material that resists etching by the fluorine-containing second plasma, such as alumina ($Al_2O_3$) or single crystal alumina (sapphire). Alternatively, the second power source may be constructed of $Al_2N_3$, ZnO, $CaF_2$, or $MgF_2$.

Figure 2:
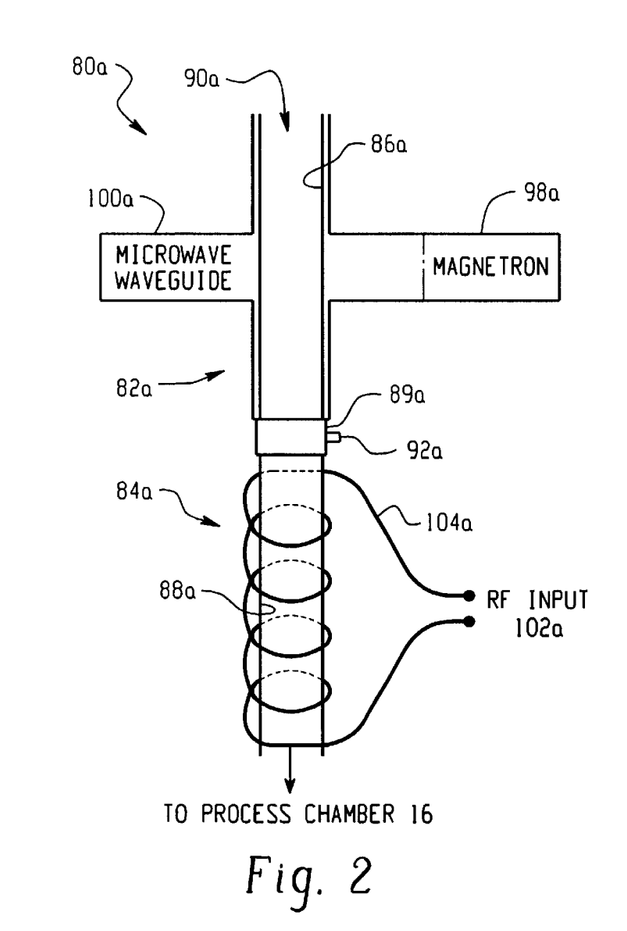
FIG. 2 is a first embodiment of a dual plasma source of the present invention which can be coupled to the process chamber of the photoresist asher of FIGS. 1a and 1b.
Figure 3:
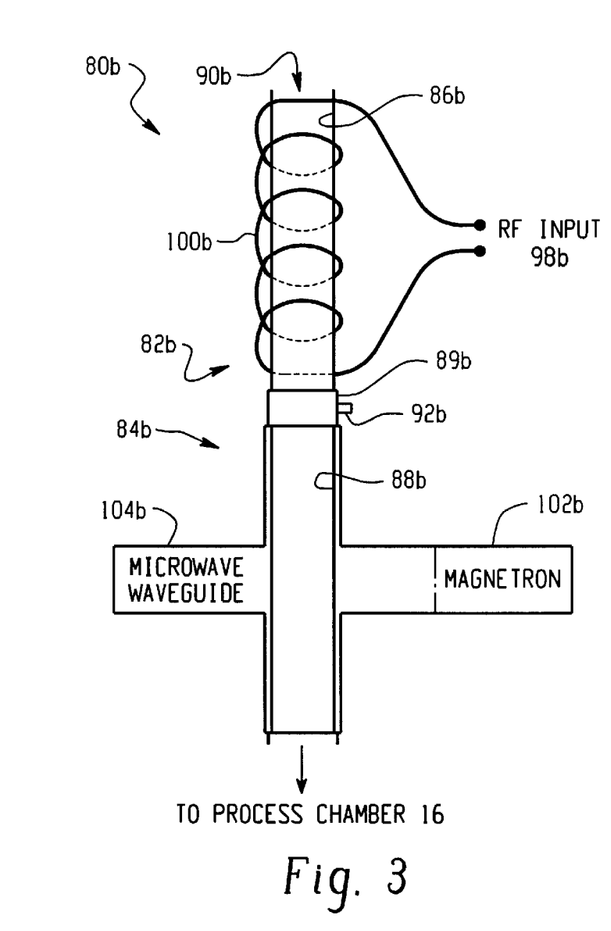
FIG. 3 is a second embodiment of a dual plasma source of the present invention which can be coupled to the process chamber of the photoresist asher of FIGS. 1a and 1b.
Figure 4:
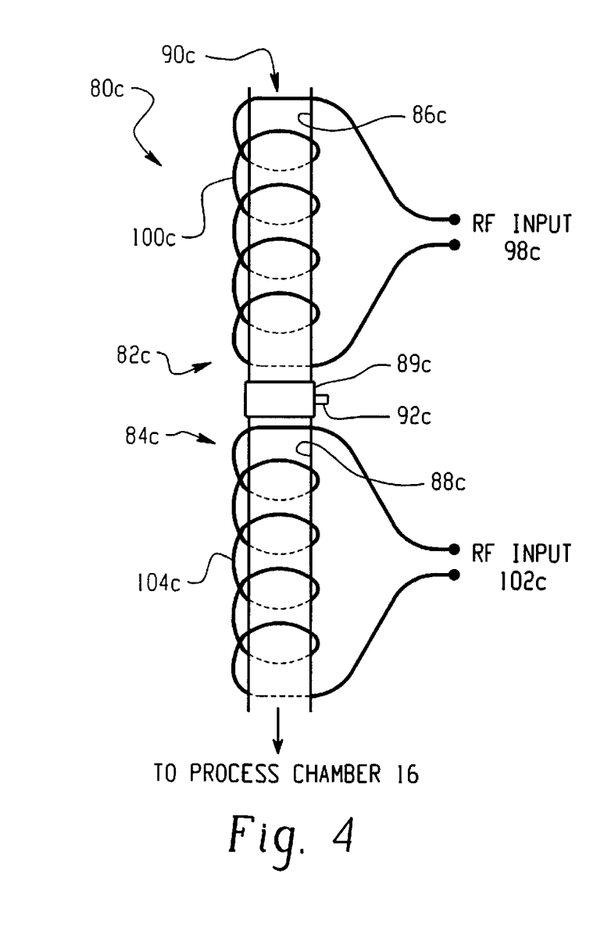
FIG. 4 is a third embodiment of a dual plasma source of the present invention which can be coupled to the process chamber of the photoresist asher of FIGS. 1a and 1b.
Figure 5:
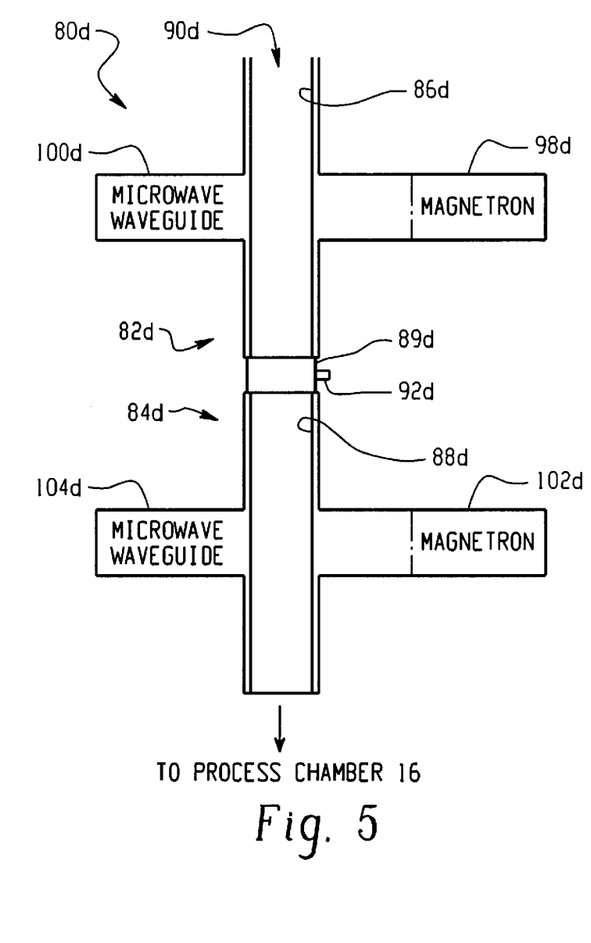
FIG. 5 is a fourth embodiment of a dual plasma source of the present invention which can be coupled to the process chamber of the photoresist asher of FIGS. 1a and 1b.

FIGS. 3 through 5 show embodiments of the invention disclosed in FIG. 2, utilizing the same type of first plasma tube 86 (quartz) and second plasma tube 88 (alumina/sapphire), but utilizing various combinations of the first and second power sources (RF or microwave) and power transfer mechanisms (coil or waveguide). Otherwise, elements in these Figures and the operation of the dual plasma sources 80b–d are similar to the elements and operation of the dual plasma source 80a of FIG. 2. That is, a desired mixture of gases (e.g., forming gas and oxygen) is introduced into the first plasma tube 86 via first inlet 90. Energy generated by the first power source 98 is coupled to the first power transfer mechanism 100 to energize the gas mixture located in the portion of the first plasma tube 86 surrounded by the first power transfer mechanism. A desired mixture of gases (e.g., a fluorinated gas) is introduced into the second plasma tube 88 via second inlet 92. Energy generated by the second power source 102 is coupled to second power transfer mechanism 104 to energize the gas mixture located in the portion of the second plasma tube 88 surrounded by the second power transfer mechanism.

in FIG. 3, the first plasma source 82b is a radio frequency (RF) driven plasma source comprising an RF source 98b (first power source) and a coil 100b (first power transfer mechanism) through which the first plasma tube 86b passes. The second plasma source 84b is a microwave driven plasma source comprising a magnetron 102b (second power source) and a waveguide 104b (second power transfer mechanism) through which the second plasma tube 88b passes.

In FIG. 4, the first plasma source 82c is a radio frequency (RF) driven plasma source comprising an RF source 98c (first power source) and a coil 100c (first power transfer mechanism) through which the first plasma tube 86c passes. The second plasma source 84c is also a radio frequency (RF) driven plasma source comprising an RF source 102c (second power source) and a coil 104c (second power transfer mechanism) through which the second plasma tube 88c passes.

In FIG. 5, the first plasma source 82d is a microwave driven plasma source comprising a magnetron 98d (first power source) and a waveguide 100d (first power transfer mechanism) through which the first plasma tube 86d passes. The second plasma source 84d is also a microwave driven plasma source comprising a magnetron 102d (second power source) and a waveguide 104d (second power transfer mechanism) through which the second plasma tube 88d passes.

In the above four embodiments (FIGS. 2–5), the first plasma tube 86 is made of quartz because the first plasma contains oxygen, and the second plasma tube 88 is made of alumina/sapphire because the second plasma contains fluorine, and the fluorinated second plasma is generated downstream of the first plasma. In the next four embodiments, the first plasma tube may be made of either material (quartz or alumina/sapphire) and the second plasma tube is constructed of the other material (alumina/sapphire or quartz) because the second plasma is not generated downstream of the first plasma. Instead, the first plasma (oxygenated or fluorinated) is generated in the first plasma tube 86 and the second plasma (fluorinated or oxygenated) is generated in the second plasma tube 88. The first and second plasma tubes meet at a third plasma tube 96 that transports the combined plasma, comprising the first and second plasma, to the process chamber 16.

Thus, in the embodiments of FIGS. 6–9, either an oxygenated gas or a fluorinated gas may be introduced into inlet 90, and the other type of gas may be introduced into inlet 92. The type of material chosen for construction the first and second plasma tubes depends on the plasma being generated therein. In the case of a fluorine-containing plasma, the plasma tube would be made from alumina/sapphire, and in the case of an oxygen-containing plasma, the plasma tube would be made of quartz.

In the preferred embodiments of FIGS. 6–9, the third plasma tube 96 is constructed of anodized (oxide coated) aluminum. The anodized aluminum is less prone to cracking or breakage and is easily cooled by known means. A resilient O-ring 106 is provided between the quartz or alumina/sapphire first plasma tube 86 and the third plasma tube 96. Similarly, a resilient O-ring 108 is provided between the alumina/sapphire or quartz second plasma tube 88 and the third plasma tube 96.

Figure 6:
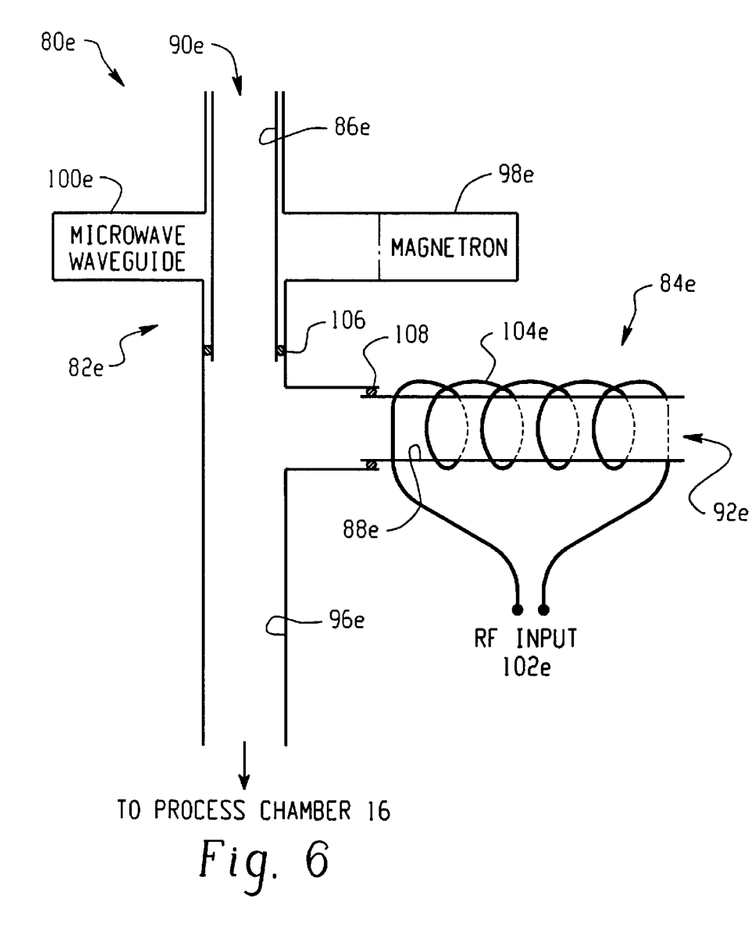
FIG. 6 is a fifth embodiment of a dual plasma source of the present invention which can be coupled to the process chamber of the photoresist asher of FIGS. 1a and 1b.

Referring to FIG. 6, a fifth embodiment of a dual plasma source 80e is shown. The first plasma source 82e is a microwave driven plasma source comprising a magnetron 98e (first power source) and a waveguide 100e (first power transfer mechanism) through which the first plasma tube 86e passes. A desired mixture of oxygen-containing or fluorine-containing gases is introduced into the first plasma tube 86e via first inlet 90e. Microwave energy generated by the magnetron 98e (e.g., operating at 2.45 GHz) and coupled to the waveguide 100e energizes the gas mixture located in the portion of the first plasma tube 86e surrounded by the waveguide.

The second plasma source 84e is a radio frequency (RF) driven plasma source comprising an RF source 102e (second power source) and a coil 104e (second power transfer mechanism) through which the second plasma tube 88e passes. A desired mixture of fluorine-containing or oxygen-containing gases is introduced into the second plasma tube 88e via second inlet 92e. RF energy generated by the RF source 102e (e.g., operating at 13.56 MHz) and coupled to the coil 104e energizes the gas mixture located in the portion of the second plasma tube 88e surrounded by the coil. The first and second plasmas that are contained in the first and second plasma tubes, respectively, are transported through the third plasma tube 96 into the process chamber 16.

Figure 7:
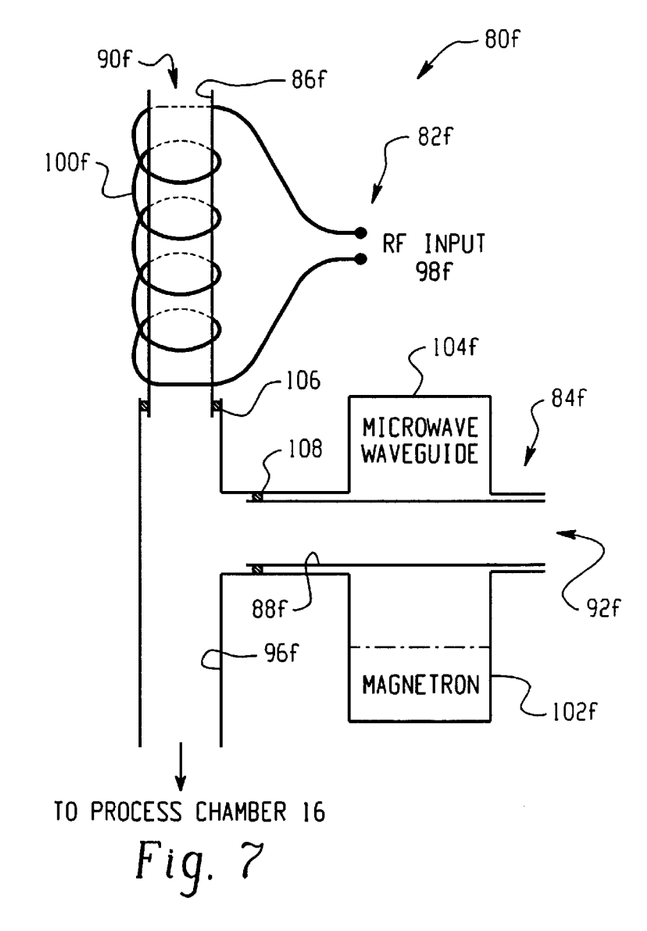
FIG. 7 is a sixth embodiment of a dual plasma source of the present invention which can be coupled to the process chamber of the photoresist asher of FIGS. 1a and 1b.
Figure 8:
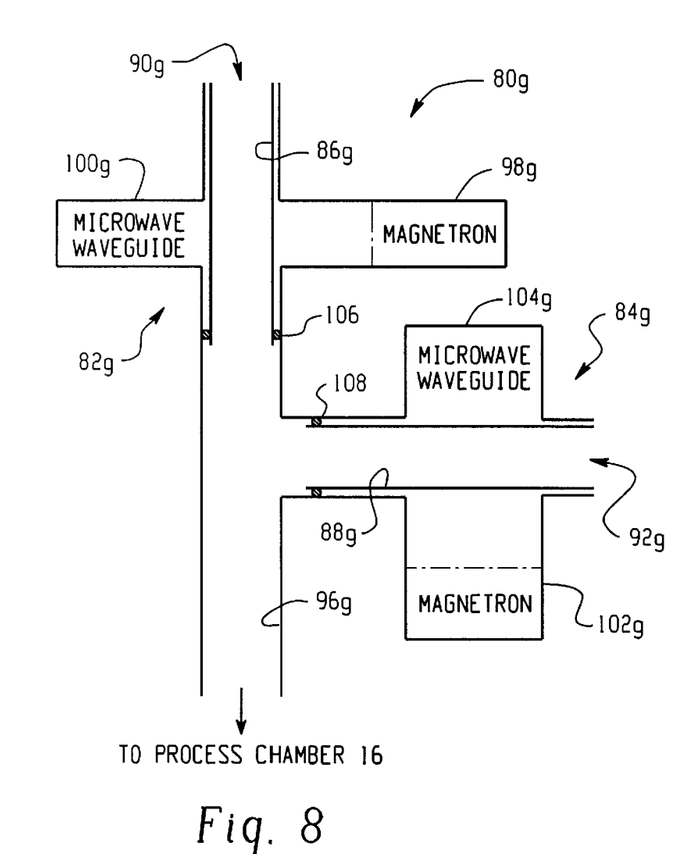
FIG. 8 is a seventh embodiment of a dual plasma source of the present invention which can be coupled to the process chamber of the photoresist asher of FIGS. 1a and 1b.
Figure 9:
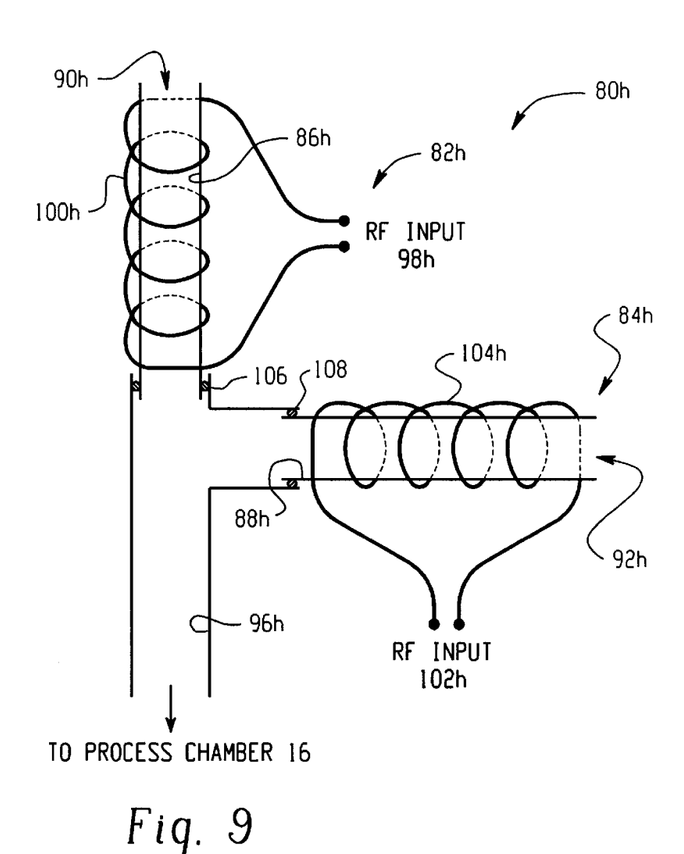
FIG. 9 is an eighth embodiment of a dual plasma source of the present invention which can be coupled to the process chamber of the photoresist asher of FIGS. 1a and 1b.

FIGS. 7 through 9 show embodiments of the invention disclosed in FIG. 6, utilizing various combinations of the first and second power sources (RF or microwave) and power transfer mechanism (coil or waveguide). Otherwise, elements in these Figures and the operation of the dual plasma sources 80f–g are similar to the elements and operation of the dual plasma source 80e of FIG. 6. That is, a desired mixture of gases is introduced into the first plasma tube 86 via first inlet 90. Energy generated by the first power source 98 is coupled to the first power of transfer mechanism 100 to energize the gas mixture located in the portion of the first plasma tube 86 surrounded by the first power transfer mechanism. A desired mixture of gases is introduced into the second plasma tube 88 via second inlet 92. Energy generated by the second power source 102 is coupled to second power transfer mechanism 104 to energize the gas mixture located in the portion of the second plasma tube 88 surrounded by the second power transfer mechanism. The first and second plasmas generated in the first and second plasma tubes are combined in the third plasma tube 96 which transports the combined plasma to the process chamber 16.

In FIG. 7, the first plasma source 82$f$ is a radio frequency (RF) driven plasma source comprising an RF source 98$f$ (first power source) and a coil 100$f$ (first power transfer mechanism) through which the first plasma tube 86$f$ passes. The second plasma source 84$f$ is a microwave driven plasma source comprising a magnetron 102$f$ (second power source) and a waveguide 104$f$ (second power transfer mechanism) through which the second plasma tube 88$f$ passes.

In FIG. 8, the first plasma source 82$g$ is a microwave driven plasma source comprising a magnetron 98$g$ (first power source) and a waveguide 100$g$ (first power transfer mechanism) through which the first plasma tube 86$g$ passes. The second plasma source 84$g$ is also a microwave driven plasma source comprising a magnetron 102$g$ (second power source) and a waveguide 104$g$ (second power transfer mechanism) through which the second plasma tube 88$g$ passes.

In FIG. 9, the first plasma source 82$h$ is a radio frequency (RF) driven plasma source comprising an RF source 98$h$ (first power source) and a coil 100$h$ (first power transfer mechanism) through which the first plasma tube 86$h$ passes. The second plasma source 84$h$ is also a radio frequency (RF) driven plasma source comprising an RF source 102$h$ (second power source) and a coil 104$h$ (second power transfer mechanism) through which the second plasma tube 88$h$ passes.

Accordingly, preferred embodiments of a dual plasma source for a plasma processing system have been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A dual plasma source (80) for a plasma processing chamber (16) comprising:
a first plasma source (82) having a first plasma passageway (86) for transporting a first plasma therethrough toward the processing chamber (16), said first plasma passageway providing a first inlet (90) for accepting a first gas to be energized by the first plasma source; and
a second plasma source (84) connected to said first plasma source (82) and having a second plasma passageway (88) for transporting a second plasma therethrough toward the processing chamber (16), said second plasma passageway providing a second inlet (92) for accepting a second gas to be energized by said second plasma source;
wherein said first plasma passageway (86) is constructed from a material that resists atomic oxygen recombination with said first plasma, and said second plasma passageway (88) is constructed from a material that resists etching by said second plasma.

2. The dual plasma source (80) of claim 1, wherein said second plasma passageway (88) is located between said first plasma passageway (86) and the processing chamber (16), such that said second plasma passageway transports both said first plasma and said second plasma toward the processing chamber.

3. The dual plasma source (80) of claim 2, wherein said first plasma source (82) comprises a first power source (98) and a first power transfer mechanism (100) for transmitting energy generated by said first power source to the first gas contained within said first plasma passageway (86); and said second plasma source (84) comprises a second power source (104) and a second power transfer mechanism (104) for transmitting energy generated by said second power source to the second gas contained within said second plasma passageway (88).

4. The dual plasma source (80) of claim 3, wherein said first plasma passageway (86) is constructed from quartz ($SiO_2$) and said second plasma passageway is (88) constructed from alumina ($Al_2O_3$).

5. The dual plasma source (80) of claim 4, wherein said second plasma passageway (88) is constructed from single crystal alumina.

6. The dual plasma source (80) of claim 3, wherein said second plasma passageway (88) is constructed from one of the following materials: $Al_2N_3$, $ZnO$, $CaF_2$, or $MgF_2$.

7. The dual plasma source (80) of claim 3, wherein said first power transfer mechanism (100) surrounds said first plasma passageway (86); and said second power transfer mechanism (104) surrounds said second plasma passageway (88).

8. The dual plasma source (80) of claim 7, wherein said first power source (98) is a magnetron (98$a$) and said first power transfer mechanism (100) is a microwave waveguide (100$a$), and wherein said second power source (102) is a radio frequency (RF) power supply (102$a$) and said second power transfer mechanism (104) is a coil (104$a$).

9. The dual plasma source (80) of claim 7, wherein said first power source (98) is a radio frequency (RF) power supply (98$b$) and said first power transfer mechanism (100) is a coil (100$b$), and wherein said second power source (102) is a magnetron (102$b$) and said second power transfer mechanism (104) is a microwave waveguide (104$b$).

10. The dual plasma source (80) of claim 7, wherein said first power source (98) is a radio frequency (RF) power supply (98$c$) and said first power transfer mechanism (100) is a coil (100$c$), and wherein said second power source (102) is a radio frequency (RF) power supply (102$c$) and said second power transfer mechanism (104) is a coil (104$c$).

11. The dual plasma source (80) of claim 7, wherein said first power source (98) is a magnetron (98$d$) and said first power transfer mechanism (100) is a microwave waveguide (100$d$), and wherein said second power source (102) is a magnetron (102$d$) and said second power transfer mechanism (104) is a microwave waveguide (10$d$).

12. A dual power source (80) for a plasma processing chamber (16) comprising:
a first plasma source (82) having a first plasma passageway (86) for transporting a first plasma therethrough toward the processing chamber (16), said first plasma passageway providing a first inlet (90) for accepting a first gas to be energized by the first plasma source;
a second plasma source (84) having a second plasma passageway (88) for transporting a second plasma therethrough toward the processing chamber (16), said second plasma passageway providing a second inlet (92) for accepting a second gas to be energized by said second plasma source; and
a third passageway (96) connected to said first and second plasma passageways for transporting said first plasma and said second plasma therethrough toward the processing chamber (16);

wherein said first plasma passageway (86) is constructed from a material that resists atomic oxygen recombination with said first plasma, and said second plasma passageway (88) and said third passageway (96) are constructed from a material that resists etching by said second plasma.

13. The dual plasma source (80) of claim 12, wherein said first plasma source (82) comprises a first power source (98) and a first power transfer mechanism (100) for transmitting energy generated by said first power source to the first gas contained within said first plasma passageway (86); and said second plasma source (84) comprises a second power source (104) and a second power transfer mechanism (104) for transmitting energy generated by said second power source to the second gas contained within said second plasma passageway (88).

14. The dual plasma source (80) of claim 13, wherein said first plasma passageway (86) is constructed from quartz ($SiO_2$) and said second plasma passageway is (88) constructed from alumina ($Al_2O_3$).

15. The dual plasma source (80) of claim 14, wherein said second plasma passageway (88) is constructed from single crystal alumina.

16. The dual plasma source (80) of claim 13, wherein said second plasma passageway (88) is constructed from one of the following materials: $Al_2N_3$, $ZnO$, $CaF_2$, or $MgF_2$.

17. The dual plasma source (80) of claim 13, wherein said third plasma tube (96) is constructed of anodized aluminum.

18. The dual plasma source (80) of claim 13, wherein said first power transfer mechanism (100) surrounds said first plasma passageway (86); and said second power transfer mechanism (104) surrounds said second plasma passageway (88).

19. The dual plasma source (80) of claim 18, wherein said first power source (98) is a magnetron (98e) and said first power transfer mechanism (100) is a microwave waveguide (100e), and wherein said second power source (102) is a radio frequency (RF) power supply (102e) and said second power transfer mechanism (104) is a coil (104e).

20. The dual plasma source (80) of claim 18, wherein said first power source (98) is a radio frequency (RF) power supply (98f) and said first power transfer mechanism (100) is a coil (100f), and wherein said second power source (102) is a magnetron (102f) and said second power transfer mechanism (104) is a microwave waveguide (104f).

21. The dual plasma source (80) of claim 18, wherein said first power source (98) is a radio frequency (RF) power supply (98h) and said first power transfer mechanism (100) is a coil (100h), and wherein said second power source (102) is a radio frequency (RF) power supply (102h) and said second power transfer mechanism (104) is a coil (104h).

22. The dual plasma source (80) of claim 18, wherein said first power source (98) is a magnetron (98g) and said first power transfer mechanism (100) is a microwave waveguide (100g), and wherein said second power source (102) is a magnetron (102g) and said second power transfer mechanism (104) is a microwave waveguide (104g).

* * * * *